(12) United States Patent
Kim et al.

(10) Patent No.: US 10,784,308 B2
(45) Date of Patent: Sep. 22, 2020

(54) DISPLAY DEVICE INCLUDING LIGHT EMITTING DIODE AND METHOD OF MANUFACTURING THE SAME

(71) Applicant: Samsung Electronics Co., Ltd., Suwon-si (KR)

(72) Inventors: Jae Yoon Kim, Yongin-si (KR); Young Sub Shin, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 41 days.

(21) Appl. No.: 15/955,894

(22) Filed: Apr. 18, 2018

(65) Prior Publication Data

US 2019/0074324 A1     Mar. 7, 2019

(30) Foreign Application Priority Data

Sep. 5, 2017  (KR) .................. 10-2017-0113362

(51) Int. Cl.
*H01L 27/15*     (2006.01)
*H01L 33/50*     (2010.01)
(Continued)

(52) U.S. Cl.
CPC .......... *H01L 27/156* (2013.01); *H01L 27/124* (2013.01); *H01L 27/1218* (2013.01);
(Continued)

(58) Field of Classification Search
None
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

EP        3413350 A1 * 12/2018  ............ H01L 27/15
KR       20130092896      * 8/2013
KR       10-1476207 B1    12/2014

*Primary Examiner* — Telly D Green
(74) *Attorney, Agent, or Firm* — Muir Patent Law, PLLC

(57) ABSTRACT

A display device including pixels respectively containing a plurality of subpixels, the display device comprises: a light emitting diode (LED) array including a plurality of LED cells, the plurality of LED cells provided in the plurality of subpixels, the plurality of LED cells configured to emit light having substantially the same wavelength, each of the plurality of LED cells having a first surface and a second surface; thin-film transistor (TFT) circuitry including a plurality of TFT cells, each of the plurality of TFT cells disposed on the first surface of an LED cell of the plurality of LED cells and including source and drain regions and a gate electrode disposed between the source and drain regions; a wavelength conversion pattern disposed on the second surface of an LED cell of the plurality of LED cells, the wavelength conversion pattern including a composite of a quantum dot and/or a polymer, the quantum dot configured to emit different colors of light from colors of light emitted from other quantum dots of other wavelength conversion patterns; and a light blocking wall disposed between two of the plurality of subpixels including the plurality of LED cells and between wavelength conversion patterns to separate the plurality of subpixels.

19 Claims, 12 Drawing Sheets

(51) Int. Cl.
*H01L 33/00* (2010.01)
*H01L 27/12* (2006.01)
*H01L 33/62* (2010.01)
*H01L 29/66* (2006.01)
*H01L 29/786* (2006.01)
*H01L 33/06* (2010.01)
*H01L 33/32* (2010.01)
*H01L 33/36* (2010.01)
*H01L 33/46* (2010.01)
*H01L 33/58* (2010.01)

(52) U.S. Cl.
CPC ...... *H01L 27/1222* (2013.01); *H01L 27/1248* (2013.01); *H01L 27/1266* (2013.01); *H01L 33/0093* (2020.05); *H01L 33/502* (2013.01); *H01L 33/504* (2013.01); *H01L 33/505* (2013.01); *H01L 33/62* (2013.01); *H01L 27/1225* (2013.01); *H01L 29/66765* (2013.01); *H01L 29/66969* (2013.01); *H01L 29/7869* (2013.01); *H01L 29/78678* (2013.01); *H01L 33/0075* (2013.01); *H01L 33/06* (2013.01); *H01L 33/32* (2013.01); *H01L 33/36* (2013.01); *H01L 33/46* (2013.01); *H01L 33/58* (2013.01); *H01L 2933/0016* (2013.01); *H01L 2933/0025* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 6/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,210,890 B2 | 7/2012 | Chae et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,361,248 B2 * | 7/2019 | Lee | H01L 27/156 |
| 2009/0207111 A1 * | 8/2009 | Wang | G09F 9/33 345/83 |
| 2012/0087108 A1 * | 4/2012 | Ke | H01L 25/0753 362/97.1 |
| 2014/0159067 A1 | 6/2014 | Sakariya et al. | |
| 2014/0291688 A1 * | 10/2014 | Tsang | H01L 27/1218 257/72 |
| 2015/0372053 A1 | 12/2015 | Bower et al. | |
| 2016/0293586 A1 | 10/2016 | Ghosh | |
| 2016/0329378 A1 | 11/2016 | Li et al. | |
| 2016/0351843 A1 | 12/2016 | Yang et al. | |
| 2017/0179192 A1 | 6/2017 | Zhang et al. | |
| 2017/0236866 A1 * | 8/2017 | Lee | H01L 27/156 257/89 |
| 2017/0250164 A1 * | 8/2017 | Takeya | H01L 25/0753 |
| 2017/0271290 A1 * | 9/2017 | Liao | H01L 24/06 |

* cited by examiner

DISPLAY DEVICE INCLUDING LIGHT EMITTING DIODE AND METHOD OF MANUFACTURING THE SAME

CROSS-REFERENCE TO RELATED APPLICATION

This application claims benefit of priority to Korean Patent Application No. 10-2017-0113362, filed on Sep. 5, 2017 in the Korean Intellectual Property Office, the disclosure of which is incorporated herein by reference in its entirety.

BACKGROUND

1. Field

The present disclosure relates to a display device including a light emitting diode (LED).

2. Description of Related Art

Semiconductor light emitting diodes (LEDs) have been used not only as light sources for lighting devices, but also as light sources for various electronic products. For example, semiconductor LEDs have commonly been used as light sources for the display panels of various devices and home appliances, such as TVs, mobile phones, PCs, laptop computers, and personal digital assistants (PDAs).

A display device of the related art, e.g., a liquid crystal display (LCD), includes an LCD panel and a backlight. Recently developing displays, however, does not include separate backlights, and uses LED devices as individual pixels. Such display devices may not only be compact, but also implement relatively high luminance display devices having greater light efficiency, compared to an LCD display of the related art.

SUMMARY

Example embodiments may provide a display device implemented on the wafer level and including a wavelength conversion means appropriate for each subpixel.

According to an example embodiment, a display device comprises a plurality of pixels, each pixel including a plurality of subpixels, a light emitting diode (LED) array including a plurality of LED cells, the plurality of LED cells provided as part of a corresponding one of the plurality of subpixels, the plurality of LED cells configured to emit light having substantially the same wavelength, each of the plurality of LED cells having a first surface and a second surface opposite to each other; thin-film transistor (TFT) circuitry including a plurality of TFT cells, each of the plurality of TFT cells disposed on corresponding first surface of the plurality of LED cells and including source and drain regions and gate electrode disposed between the source and drain regions; wavelength conversion patterns, each wavelength conversion pattern disposed on corresponding second surface of the plurality of LED cells, each wavelength conversion pattern including a composite of a quantum dot and/or a polymer, the quantum dot configured to emit a different color of light from colors of light emitted from the other subpixels of the plurality of subpixels; and a light blocking wall disposed between the plurality of LED cells and between the wavelength conversion pattern to separate the plurality of subpixels.

According to an example embodiment, a display device comprises an array of pixels, each of which includes a first subpixel, a second subpixel, and a third subpixel; a plurality of LED cells, each of the plurality of LED cells forming part of a corresponding one of the first subpixels, the second subpixels, and the third subpixels, the plurality of LED cells configured to emit light having a first wavelength, each of the plurality of LED cells having a first surface and a second surface opposite to each other; a plurality of TFT cells disposed on first surfaces of the plurality of LED cells, each of the plurality of TFT cells including source and drain regions and a gate electrode disposed between the source and drain regions; a plurality of data lines electrically connecting source regions of the plurality of TFT cells in a row direction; a gate line electrically connecting gate electrodes of the plurality of TFT cells in a column direction; a plurality of first wavelength conversion patterns, each first wavelength conversion pattern being disposed on the second surface of corresponding LED cells that form a corresponding one of the first subpixels, each first wavelength conversion pattern including a composite of a first quantum dot and/or a polymer, the first quantum dot configured to convert light having the first wavelength into light having a second wavelength; and a plurality of second wavelength conversion patterns, each second wavelength conversion pattern being disposed on the second surface of corresponding LED cells that form a corresponding one of the second subpixels, each second wavelength conversion pattern including a composite of a second quantum dot and/or a polymer, the second quantum dot configured to convert light having the first wavelength into light having a third wavelength.

According to an example embodiment, a display device comprises an array of pixels, each of the pixels including a first subpixel, a second subpixel, and a third subpixel; a plurality of LED cells, each of the plurality of LED cells forming a prat of corresponding one of the first subpixels, the second subpixels, and the third subpixels, the plurality of LED cells including the same epitaxial layer, each of the plurality of LED cells having a first surface and a second surface opposite to each other; an insulating film disposed on the first surface of the plurality of LED cells; a plurality of TFT cells insulated from the plurality of LED cells by the insulating film, each of the plurality of TFT cells disposed in a region of the first surface of corresponding one of the plurality of LED cells; and a plurality of first wavelength conversion patterns and a plurality of second wavelength conversion patterns, each first wavelength conversion pattern and each second wavelength conversion pattern disposed on corresponding second surfaces of the plurality of LED cells respectively disposed in corresponding first subpixels and second subpixels, each of the first and second wavelength conversion patterns including a composite of a quantum dot configured to emit light and/or a polymer obtained from a photosensitive resin composition, wherein the first wavelength conversion patterns are configured to emit light having a first wavelength and the second wavelength conversion patterns are configured to emit light having a second wavelength different from the first wavelength.

According to an embodiment, a method of manufacturing a display device comprises forming a first conductive semiconductor layer on a first substrate, forming an active layer on the first conductive semiconductor layer, forming a second conductive semiconductor layer on the active layer, removing a portion the second conductive semiconductor layer to form a second conductive semiconductor pattern, removing a portion of the active layer to form an active pattern, forming a first electrode on the first conductive semiconductor layer at a portion that the first conductive semiconductor layer and the active layer are removed, forming a second electrode on the second conductive semiconductor pattern, forming a first insulating layer on the first electrode, the second electrode, the first conductive semiconductor layer and the second conductive semiconductor pattern, forming a thin film transistor (TFT) on the insulating film, forming a second insulating layer on the TFT, forming a conductor pattern electrically connecting a source/drain of the TFT and the second electrode, attaching a second substrate on the TFT with an adhesive layer, removing the first substrate from the first conductive semiconductor layer, removing a portion of the first conductive semiconductor layer to expose the first insulating layer and to form a first conductive semiconductor pattern, forming a wavelength conversion pattern on the first conductive semiconductor pattern and forming a light blocking pattern on the first insulating layer exposed by removing the portion of the first conductive semiconductor layer, wherein the first conductive semiconductor pattern, the active pattern and the second conductive semiconductor pattern form a light emitting diode (LED), and wherein the TFT is fully covered by the first conductive semiconductor pattern in a plan view.

BRIEF DESCRIPTION OF DRAWINGS

The above and other aspects, features and other advantages of the present inventive concept will be more clearly understood from the following detailed description, when taken in conjunction with the accompanying drawings, in which.

DETAILED DESCRIPTION

Hereinafter, various example embodiments of the present inventive concept will be described with reference to the attached drawings.

Figure 1:
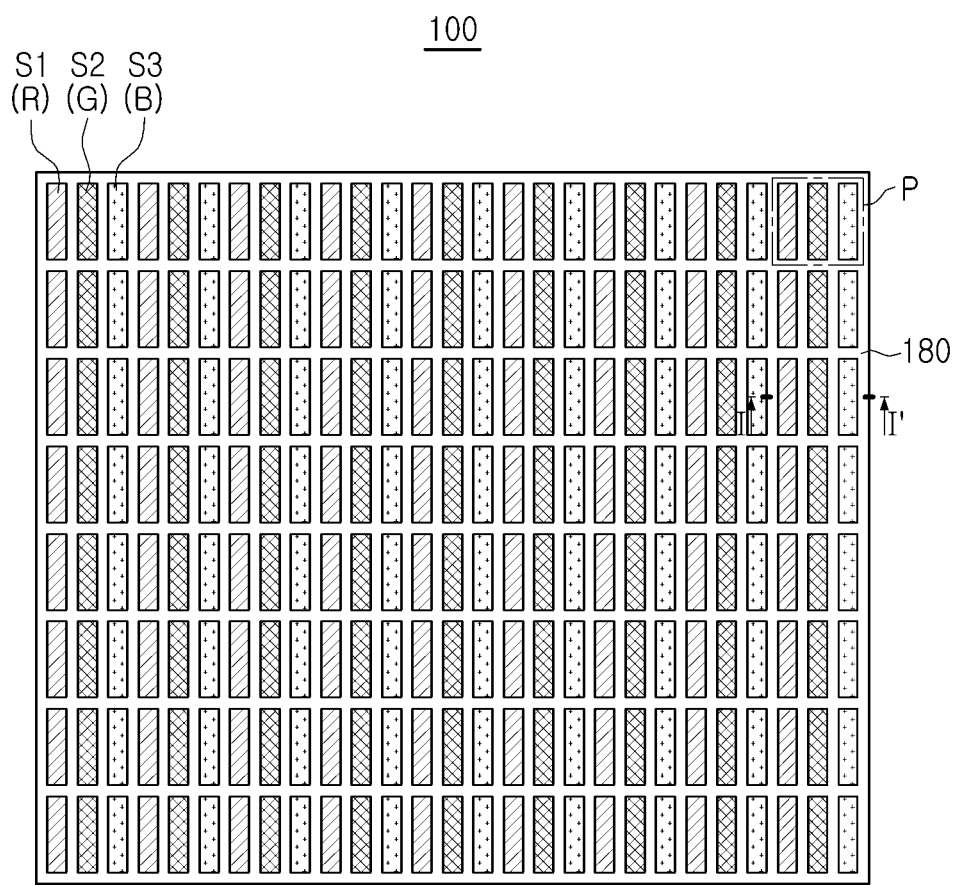
FIG. 1 is a top view of a display device including a light emitting diode (LED) according to an example embodiment.
Figure 2:
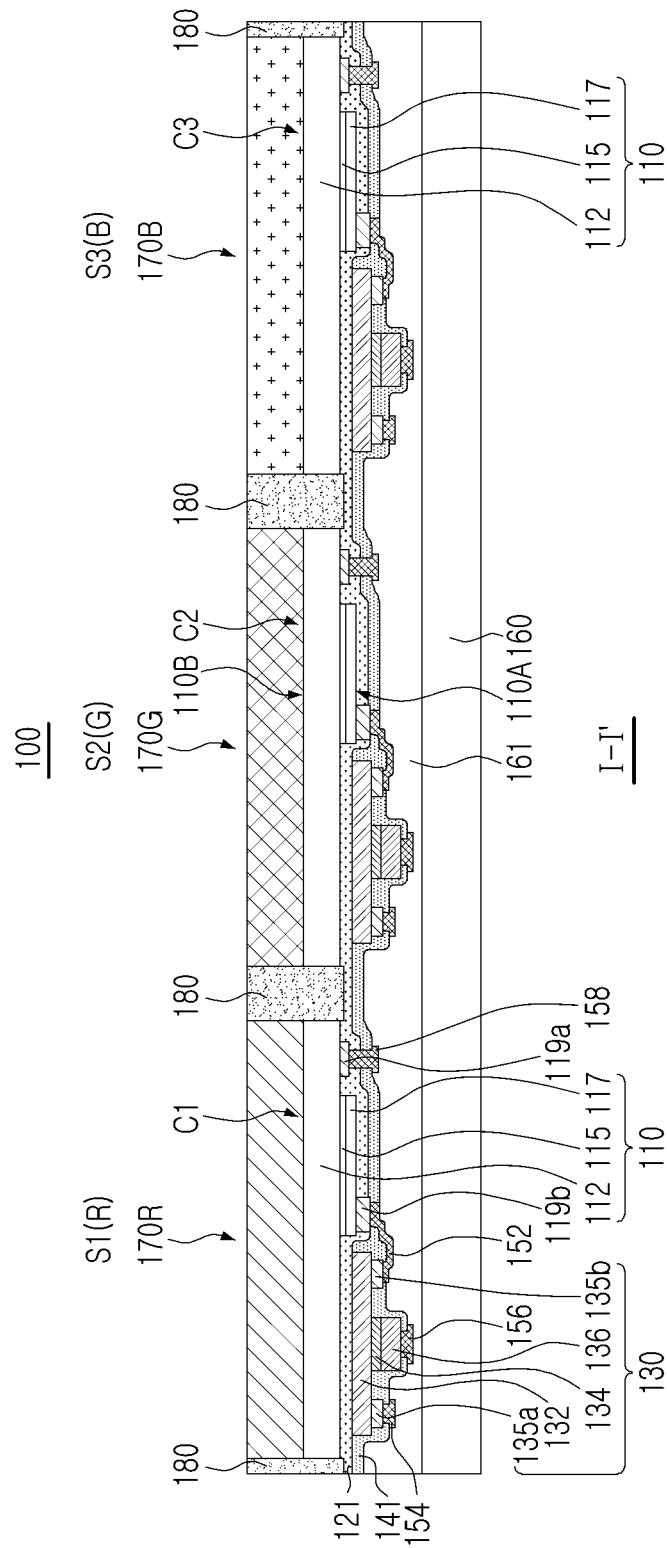
FIG. 2 is a cross-sectional view taken along line I-I' of a display device illustrated in FIG. 1.

FIG. 1 is a top view of a display device including a light emitting diode (LED) according to an example embodiment, while FIG. 2 is a cross-sectional view taken along line I-I' of the display device illustrated in FIG. 1.

With reference to FIGS. 1 and 2, a display device 100 may include an array of pixels P having a first subpixel S1, a second subpixel S2, and a third subpixel S3, configured to emit light having different colors. Each of the first, second and third subpixels S1, S2 and S3 may be separately controlled to emit a selected intensity of light according to a corresponding driving signal applied thereto.

The array of the pixels P according to an example embodiment is illustrated as being 9×8, but columns and rows may be implemented in any appropriate number (e.g., 1,024×768). For example, various arrays of pixels according to desired resolution may be provided. Each pixel P may be formed by a combination of a first subpixel S1, a second subpixel S2 and a third subpixel S3 (e.g., neighboring subpixels S1, S2 and S3) to emit a selected color resulting from separately driving such subpixels S1, S2 and S3.

The display device 100 may be configured to respectively provide different colors to the first subpixels S1, the second subpixels S2, and the third subpixels S3, in order to display a color image. For example, the first subpixels S1, the second subpixels S2, and the third subpixels S3 may be red subpixels, green subpixels, and blue subpixels, respectively.

With reference to FIG. 2, the display device 100 according to an example embodiment may include an LED array having a plurality of LED cells C1, C2, and C3 disposed above a support substrate 160.

The display device 100 may have a rectangular shape or another appropriate shape, as illustrated in FIG. 1. The display device 100 may be planar. In certain example embodiments, the display device 100 may employ a flexible substrate as the support substrate 160 for the display device 100 to have a curved profile. For example, the support substrate 160 may be a flexible substrate, and the flexible substrate may be formed of a polyimide, but the material of the substrate is not limited thereto. In another example embodiment, the support substrate 160 may be rigid and embodied as a glass substrate or a metal substrate.

The LED array may include a thin-film transistor (TFT) cell 130 disposed in each of the plurality of LED cells C1, C2, and C3. The LED array in which the TFT cell 130 is disposed may be bonded to the support substrate 160 by a bonding resin layer 161 (e.g., an adhesive layer). The material of the bonding resin layer 161 may be at least one selected from a group consisting of polyacrylate, polyimide, polyamide, and benzocyclobutene (BCB).

A cross-sectional structure illustrated in FIG. 2 represents a portion corresponding to a single pixel P of the display device 100 illustrated in FIG. 1. Each of LED cells illustrated in FIG. 2 may be construed as being a first LED cell C1, a second LED cell C2, and a third LED cell C3, related to the first subpixel S1, the second subpixel S2, and the third subpixel S3.

Each of the first LED cell C1, the second LED cell C2, and the third LED cell C3 may include semiconductor layers 110 having a first conductive semiconductor layer 112 and a second conductive semiconductor layer 117 and an active layer 115 interposed therebetween, as well as a first surface 100A and a second surface 100B, disposed in opposing directions. For example, the first, second and third LED cells C1, C2 and C3 may be LED structures. For example, each of the first, second and third LED cells C1, C2 and C3 may be an LED structure including two conductive semiconductor layers 112 and 117, and an active layer 115 disposed therebetween. For example, the first surface 100A may be one surface of an LED structure, and the second surface 100B may be another surface of the LED structure opposite to the first surface 100A. For example, each of the first and second surfaces may comprise one surface of one conductive semiconductor layer, e.g., 110B shown in FIG. 2, or may comprise a combined surface of one or more of conductive semiconductor layers and active layers, e.g., 110A shown in FIG. 2. (The first surface 110A of FIG. 2 includes lower surfaces of layers 112 and 117.) The first LED cell C1, the second LED cell C2, and the third LED cell C3 may be micro-size LEDs. For example, since the first LED cell C1, the second LED cell C2, and the third LED cell C3 may be provided in a subpixel forming a pixel, the first LED cell C1, the second LED cell C2, and the third LED cell C3 may have a structure in which a side thereof has a length less than or equal to 10 µm, e.g., in a plan view. For example, each of the first, second and third LED cells C1, C2 and C3 may have a less area than 100 µm² in a plan view.

Figure 6:
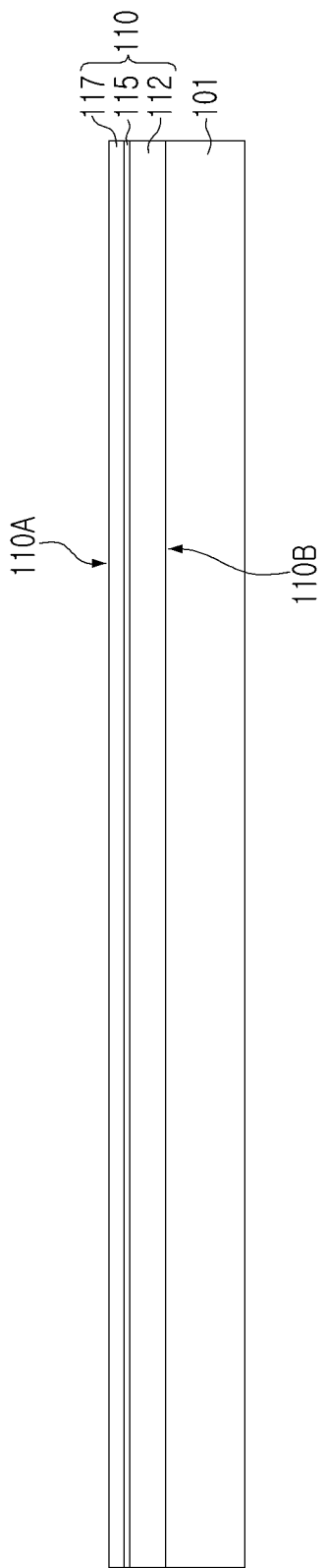
FIGS. 6 to 12 are cross-sectional views illustrating a method of manufacturing a display device including the LED according to an example embodiment.

The semiconductor layers 110 of respective LED cells C1, C2 and C3 may be formed using the same process in a single wafer (see FIG. 6). The semiconductor layers 110 of respective LED cells C1, C2 and C3 may be grown in the same manner and may be separated from each other (e.g., by removing a portion of the semiconductor layers 110) to provide the first LED cell C1, the second LED cell C2, and the third LED cell C3.

The active layer 115 of the first LED cell C1, the second LED cell C2, and the third LED cell C3 may be configured to emit substantially the same wavelength of light. For example, the active layer 115 may emit blue light (e.g., having a wavelength of 440 nm to 460 nm), ultraviolet light, or near ultraviolet light (e.g., having a wavelength of 380 nm to 440 nm).

As described above, a plurality of TFT cells 130 may be disposed on the first surfaces 100A of the first LED cell C1, the second LED cell C2, and the third LED cell C3 respectively. In FIG. 2, among the plurality of TFT cells 130, three TFT cells respectively corresponding to the first LED cell C1, the second LED cell C2, and the third LED cell C3 are illustrated.

An insulating film 121 may be disposed between the LED array and the plurality of TFT cells 130. As illustrated in FIG. 2, the insulating film 121 may be disposed on the first surface 110A of the first LED cell C1, the second LED cell C2, and the third LED cell C3.

The plurality of TFT cells 130 may include a semiconductor layer 132 disposed on the insulating film 121. For example, the semiconductor layer 132 forming the plurality of TFT cells 130 may include a silicon-based semiconductor, such as polysilicon, a semiconductor oxide, such as, indium gallium zinc oxide (IGZO) and zinc oxide (ZnO), or a compound semiconductor, such as silicon germanium (SiGe).

The plurality of TFT cells 130 may include a semiconductor layer 132 providing a channel region, a source electrode 135a and a drain electrode 135b, disposed in a first region and a second region (i.e., source and drain regions) of the semiconductor layer 132, and a gate insulating film 134 and a gate electrode 136, sequentially disposed between the first region and the second region. For example, a TFT cell 130, as used herein, may be a thin film transistor including corresponding components. For example, as shown in FIG. 2, a TFT cell 130 may include a gate electrode 136, source/drain electrodes 135a and 135b, a gate insulating film 134 and a semiconductor layer 132 including a channel region.

The plurality of TFT cells 130 may form a TFT circuitry to control driving of the pixels (e.g., the subpixels). For example, in each of the first subpixel S1, the second subpixel S2, and the third subpixel S3, the drain electrode 135b of a TFT cell 130 may be electrically connected to a second electrode 119b of a corresponding LED cell (e.g., C1, C2, or C3) by a connection wiring 152. For example, the TFT cells electrically connected to the LED cells are configured to supply electric power to drive the LED cells. A first electrode 119a of LED cells C1, C2, and C3 may be electrically connected to a common line 158 to be grounded. The source electrodes 135a of the plurality of TFT cells 130 may be electrically connected by a data line 154 in a first direction (e.g., in a row direction). The gate electrodes 136 of the plurality of TFT cells 130 may be connected by a gate line 156 in a second direction (e.g., in a column direction) intersecting the first direction. Such a circuit configuration and operation will be subsequently described with reference to FIG. 3.

In a manner different from the TFT circuitry employed in the above example embodiment, in another example embodiment, TFT circuitry may be configured to further include an additional TFT and/or a thin-film capacitor, or the like. As described above, a semiconductor oxide transistor, as well as a silicon transistor, may be used as the TFT. For example, the TFT may include silicon or an oxide semiconductor as a semiconductor of a FET (field-effect-transistor). For example, the oxide semiconductor may be a metal oxide semiconductor. A semiconductor oxide transistor contributes to reducing a leakage current to have a level lower than that of the silicon transistor. The silicon transistor may be converted faster than the semiconductor oxide transistor. Display performance may be optimized by configuring a pixel circuit with a gate line and a data line, and by an appropriate selection of the semiconductor oxide transistor and the silicon transistor. For example, the semiconductor oxide transistor may be an oxide transistor including an oxide semiconductor. For example, the oxide semiconductor may be a compound oxide semiconductor. For example, the compound oxide semiconductor may be indium gallium zinc oxide (IGZO). In certain embodiments, the oxide transistor may be a metal oxide transistor. For example, the oxide semiconductor of the oxide transistor may be a metal-oxide. (e.g., copper oxide (CuO, $Cu_2O$), tin dioxide ($SnO_2$), zinc oxide (ZnO), etc.)

A first wavelength conversion pattern 170R, a second wavelength conversion pattern 170G, and a third wavelength conversion pattern 170B may be disposed on a second surface 110B of the first LED cell C1, the second LED cell C2, and the third LED cell C3 respectively. Each of the first wavelength conversion pattern 170R, the second wavelength conversion pattern 170G, and the third wavelength conversion pattern 170B may include a composite of a quantum dot and/or a polymer. Quantum dots of wavelength conversion patterns 170R, 170G and 170B may be configured to emit different colors of light from the first subpixel S1, the second subpixel S2, and the third subpixel S3 respectively. For example, one of the first, second and third subpixel S1, S2 and S3 may emit a different color of light from the light emitted from the other subpixels. The polymer may be provided as a host matrix in which a quantum dot is dispersed. For example, quantum dots may be isolated as guest species in a host matrix of the polymer structure.

The polymer may be a product obtained from a photosensitive resin composition after a photolithography (exposure/development) process. Since the first wavelength conversion pattern 170R, the second wavelength conversion pattern 170G, and the third wavelength conversion pattern 170B are manufactured using the photolithography process, the first wavelength conversion pattern 170R, the second wavelength conversion pattern 170G, and the third wavelength conversion pattern 170B may be provided to have a fine and precise pattern. The first wavelength conversion pattern 170R, the second wavelength conversion pattern 170G, and the third wavelength conversion pattern 170B may be implemented to have a fine pattern having a size corresponding to that of the subpixel (e.g., a side having a length of 10 µm or less). For example, longest sides of the respective subpixels may be 10 µm or less, e.g., in a plan view.

In an example embodiment, when a colloid is synthesized, particle sizes of the quantum dot may be relatively freely adjusted, and may be uniformly adjusted. For example, in a case in which the quantum dot has a size of 10 nm or less, as the size of the quantum dot is reduced, a quantum confinement effect in which a band gap is increased, may be significant, thereby increasing energy density. Since the quantum dot has a theoretical quantum efficiency of about 100% and may emit light having a high color purity, increased luminous efficiency and improved color reproducibility may be obtained. In addition, since the quantum dot is mixed with a photosensitive resin composition, thereby patterning the quantum dot, a wavelength conversion material, the quantum dot may be used as a wavelength conversion structure for an LED cell forming the subpixel.

In an example embodiment, the first LED cell C1, the second LED cell C2, and the third LED cell C3 may include semiconductor layers 110 (e.g., the active layer 115) emitting ultraviolet light or near ultraviolet light (e.g., light having a wavelength of 380 nm to 440 nm). In the first subpixel S1, the second subpixel S2, and the third subpixel S3, the first, second and third LED cells C1, C2 and C3 may be combined with the first wavelength conversion pattern 170R, the second wavelength conversion pattern 170G, and the third wavelength conversion pattern 170B, thereby emitting red light, green light, and blue light, respectively.

The first wavelength conversion pattern 170R, the second wavelength conversion pattern 170G, and the third wavelength conversion pattern 170B may include a red quantum dot, a green quantum dot, and a blue quantum dot, respectively. For example, quantum dots described above may include a group II-VI compound, a group III-V compound, a group IV-VI compound, a group IV compound, a group compound, a group I-II-IV-VI compound, or combinations thereof.

In certain example embodiments, the first wavelength conversion pattern 170R, the second wavelength conversion pattern 170G, and the third wavelength conversion pattern 170B may include a light diffuser to allow light to be uniformly dispersed. For example, the light diffuser may include a metallic oxide particle, a metal particle, and combinations thereof.

The display device 100 may further include a light blocking wall 180 to optically isolate each of the first subpixel S1, the second subpixel S2, and the third subpixel S3 from the other subpixels. The light blocking wall 180 may be interposed between the plurality of LED cells C1, C2, and C3 and between the first wavelength conversion pattern 170R, the second wavelength conversion pattern 170G, and the third wavelength conversion pattern 170B. The light blocking wall 180 may include a black matrix, but is not limited thereto. For example, the light blocking wall 180 may be a light blocking pattern.

The bonding resin layer 161 provided to bond the support substrate 160 to the LED array may include a light reflective powder to prevent light leakage in a direction toward the support substrate 160. For example, the light reflective powder may include an oxide, such as titanium dioxide ($TiO_2$) or aluminum oxide ($Al_2O_3$), or metal particles.

Instead that the bonding resin layer 161 contains the light reflecting powder, a separate reflecting structure may be employed. For example, a protective insulating layer 141 may be realized to have a distributed Bragg reflector (DBR) structure in which a plurality of insulating films having different refractive indices are stacked. For example, the protective insulating layer 141 may include a plurality of layers of films in which two different insulating films are alternately stacked. The DBR structure may be provided as a structure in which the plurality of insulating films having different refractive indices are repeatedly stacked two to 100 times. The plurality of insulating films may be selected from a group consisting of an oxide or a nitride, such as $SiO_2$, SiN, $SiO_xN_y$, $TiO_2$, $Si_3N_4$, $Al_2O_3$, $ZrO_2$, TiN, AlN, TiAlN, and/or TiSiN.

The display device 100 illustrated in FIG. 1 may be used not only for a tablet computer, a laptop computer, a mobile phone, and a media player, but also for a display of a wearable device requiring a high resolution, a virtual reality (VR) display or an augmented reality (AR) display.

Figure 3:
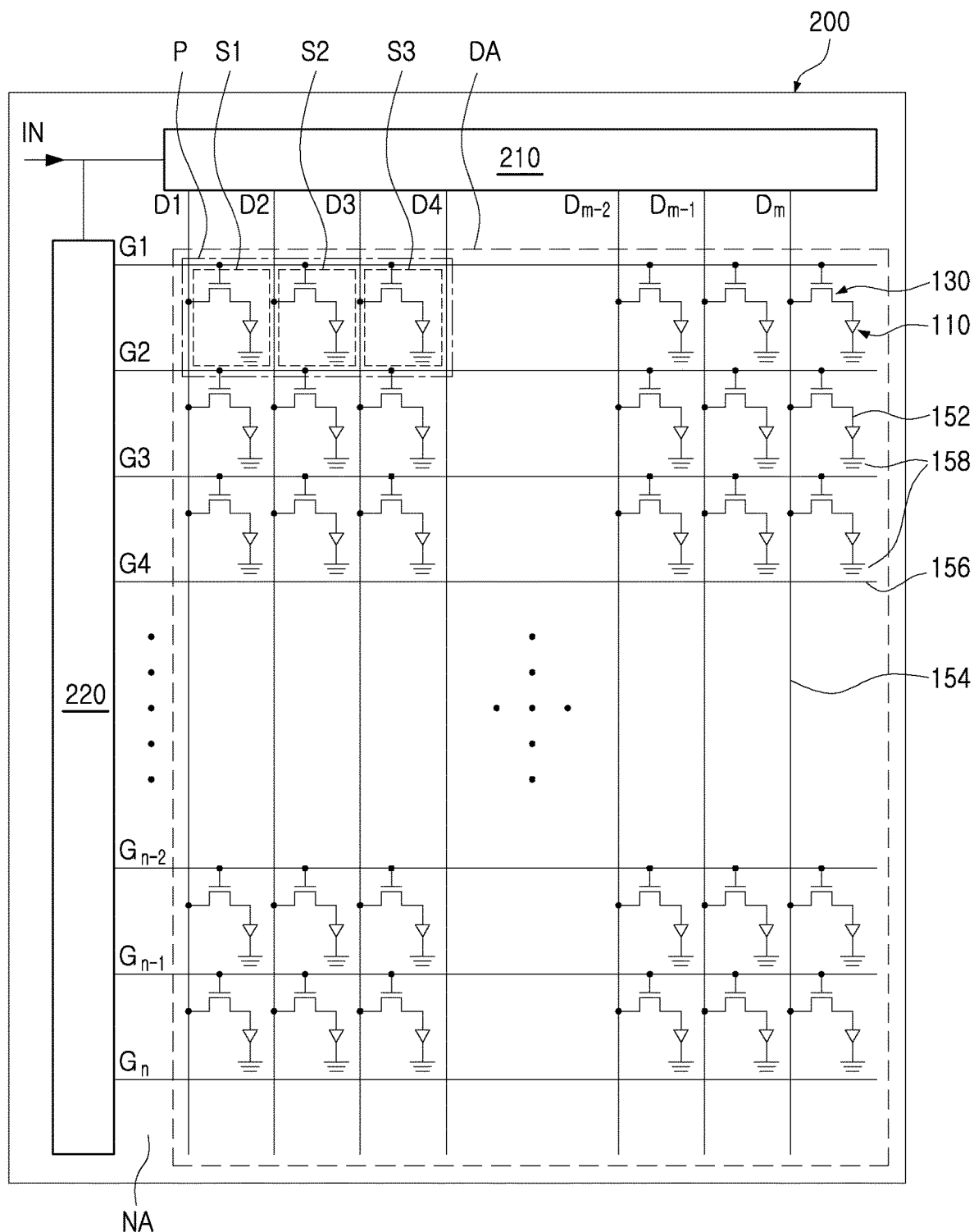
FIG. 3 is a driving circuit diagram implemented in a display device illustrated in FIG. 1.

FIG. 3 is a driving circuit diagram implemented in a display device illustrated in FIG. 1.

With reference to FIG. 3, a circuit diagram of the display device 200 in which m×n subpixels are arranged is illustrated. The display device 200 may be the same display device illustrated in FIGS. 1 and 2 including active region DA and driving circuits 210 and 220 as the driving circuits 210 and 220 are disposed on the same semiconductor substrate 160 that the active region DA is disposed. In certain embodiments, the display device 200 may include the display device 100 illustrated in FIGS. 1 and 2, and may additionally include driving circuits 210 and 220, i.e., the driving circuits 210 and 220 may be formed in different chips/substrates than the substrate 160 that the active region DA is formed.

Each of a first subpixel S1, a second subpixel S2, and a third subpixel S3 may receive a data signal through a path provided in a vertical direction (in a row direction), e.g., data lines (D1, D2, D3 . . . Dm−2, Dm−1, Dm). Each of the first subpixel S1, the second subpixel S2, and the third subpixel S3 may receive a control signal (e.g., a gate signal) through a path extending in a horizontal direction (in a column direction), e.g., gate lines (G1, G2, G3 . . . Gn−2, Gn−1, Gn).

The first subpixel S1, the second subpixel S2, and the third subpixel S3 may be arranged in a rectangular array or in another form. An array of a plurality of pixels P including each of the first subpixel S1, the second subpixel S2, and the third subpixel S3 may form an active region DA for display and may be used to display an image to a user. An inactive region NA of the display device 100 may be formed along one or more edges of the active region DA. The inactive region NA may form a boundary, e.g., a periphery, for the display device 100, and a pixel P may not be present in the periphery of the display device 100.

Driver circuits 210 and 220 may be employed to control an operation of the pixels P, e.g., a plurality of subpixels S1, S2, and S3. The driver circuits 210 and 220 may be formed as an integrated circuit (e.g., a chip), a thin-film transistor panel circuit, or a further appropriate circuit and may be disposed in the inactive region (NA) of the display device 100. The driver circuits 210 and 220 may include a microprocessor, a memory such as a storage, a processing circuit, and/or a communications circuit. During an operation of the display, a system control circuit may provide information IN to the driver circuits 210 and 220 from an image to be displayed in the display 100.

In order to display an image on the pixel P, a first driver circuit 210 may provide image data to the data lines (D1, D2, D3 . . . Dm−2, Dm−1, Dm) and may send a clock signal and other control signals to a second driver circuit 220 (e.g., a 'gate driver circuit').

The second driver circuit 220 may be implemented using the integrated circuit and/or the thin-film transistor circuit. A gate signal may be transmitted to control the first subpixel S1, the second subpixel S2, and the third subpixel S3 arranged in the column direction along the gate lines (G1, G2, G3 Gn−2, Gn−1, Gn) of the display device 100.

The first subpixel S1, the second subpixel S2, and the third subpixel S3 may include TFT cells (130, e.g., 'driving transistors') respectfully connected to the first LED cell C1, the second LED cell C2, and the third LED cell C3, in series. Each of the first subpixel S1, the second subpixel S2, and the third subpixel S3 is not limited to a circuit composition illustrated above. For example, each of the first subpixel S1, the second subpixel S2, and the third subpixel S3 may be implemented with various circuits further including other elements. For example, each of the first subpixel S1, the second subpixel S2, and the third subpixel S3 may further include a capacitor used to store loaded date between successive image frames, or one or more switching transistors to support a data loading operation and/or another operation.

Figure 4:
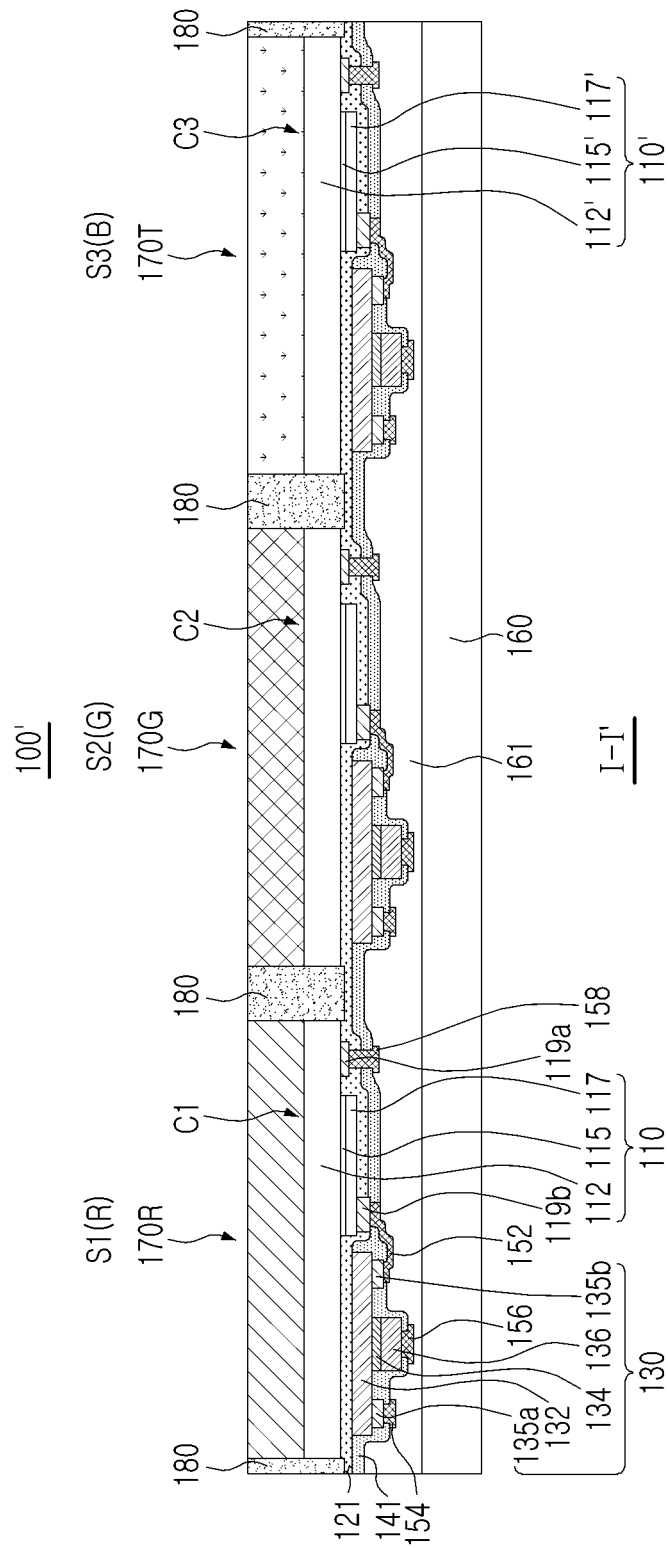
FIG. 4 is a cross-sectional view of a display device including the LED according to various example embodiments.

FIG. 4 is a cross-sectional view of a display device including an LED according to various example embodiments.

A display device 100' illustrated in FIG. 4 may be similar to the display device 100 illustrated in FIG. 1 except for an emission wavelength of an LED cell and composition of a third subpixel. For example, the descriptions of components of the embodiments illustrated in FIGS. 1 to 3 may be applied to the embodiment illustrated in FIG. 4 unless a specific opposite description is provided.

In an example embodiment, a first LED cell C1, a second LED cell C2, and a third LED cell C3 may include semiconductor layers (110', e.g., including an active layer 115') emitting blue light. In a manner similar to the display device 100 illustrated in FIG. 2, a first subpixel S1 and a second subpixel S2 may be combined with a first wavelength conversion pattern 170R and a second wavelength conversion pattern 170G, thereby emitting red light and green light, respectively. However, a third LED cell C3 may be configured to emit blue light, and the third subpixel S3 may not include a separate wavelength conversion structure. The third LED cell C3 may have a light transmissive pattern 170T including a transparent resin so as to match levels between cells so that a light blocking wall 180 may be easily formed. For example, the light transmissive pattern may have a thickness substantially the same as the thicknesses of wavelength conversion structures of neighboring subpixels. In certain example embodiments, the light transmissive pattern 170 may include a light diffuser described above.

Figure 5:
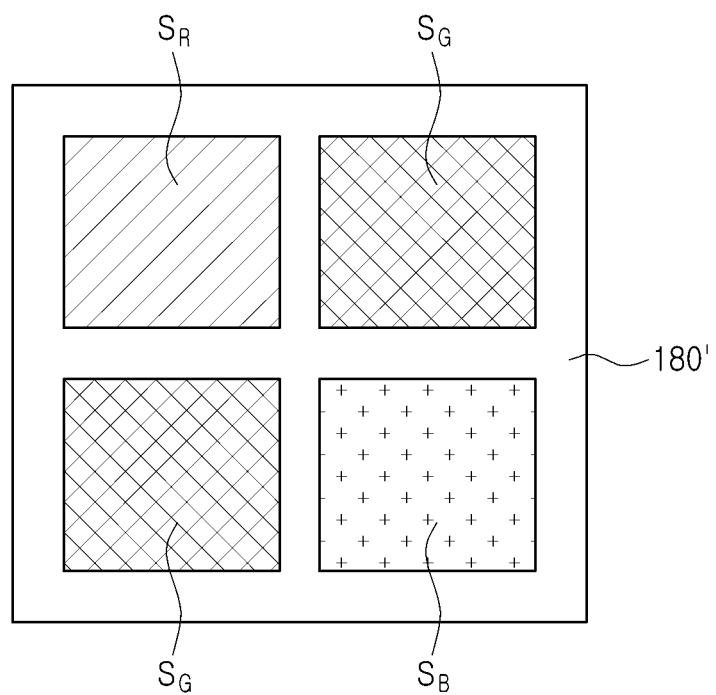
FIG. 5 is a layout of a pixel employed in a display device including the LED according to an example embodiment.

In FIG. 1, a first subpixel, a second subpixel, and a third subpixel, configured to emit red light, green light, and blue light (RGB) are illustrated as being arranged side by side to have a rectangular shape. However, arrangements of the first subpixel, the second subpixel, and the third subpixel are not limited thereto and various arrangements may be possible. In certain embodiments, a portion of subpixels arranged in a single pixel may be arranged in different numbers. For example, with reference to FIG. 5, subpixels $S_R$ and $S_B$ corresponding to red and blue subpixels, respectively, in a single pixel may be disposed in a diagonal direction, and two subpixels $S_G$ corresponding to green subpixel may be arranged in another diagonal direction.

FIGS. 6 to 12 are cross-sectional views illustrating a method of manufacturing a display device including an LED according to an example embodiment.

With reference to FIG. 6, semiconductor layers 110 for an LED may be formed on a growth substrate 101. The semiconductor layers 110 may include a first conductive semiconductor layer 112, an active layer 115, and a second conductive semiconductor layer 117.

The growth substrate 101 may be an insulating substrate, a conductive substrate, or a semiconductor substrate. For example, the growth substrate 101 may include sapphire, SiC, Si, $MgAl_2O_4$, MgO, $LiAlO_2$, $LiGaO_2$, and/or GaN. Each layer of the semiconductor layers 110 may be a nitride semiconductor. The semiconductor layers 110 may be grown on the growth substrate 101 using a process, such as metal-organic chemical vapour deposition (MOCVD), molecular beam epitaxy (MBE), and/or hydride vapour phase epitaxy (HVPE).

The first conductive semiconductor layer 112 may be a nitride semiconductor layer satisfying n-type $Al_xIn_yGa_{1-x-y}N$ ($0 \le x \le 1$, $0 \le y \le 1$, $0 \le x+y \le 1$), while an n-type impurity may be silicon (Si). For example, the first conductive semiconductor layer 112 may be n-type GaN layer. The second conductive semiconductor layer 117 may be a nitride semiconductor layer satisfying p-type $Al_xIn_yGa_{1-x-y}N$, while a p-type impurity may be magnesium (Mg). For example, the second conductive semiconductor layer 117 may be p-type AlGaN/GaN. The active layer 115 may have multiple quantum well (MQW) structure in which quantum well layers and quantum barrier layers are alternately stacked. For example, in a case in which a nitride semiconductor is used, the active layer 115 may have a GaN/InGaN MQW structure. The semiconductor layers 110 may have a first surface 110A and a second surface 110B, provided by the second conductive semiconductor layer 117 and the first conductive semiconductor layer 112, respectively.

Figure 7:
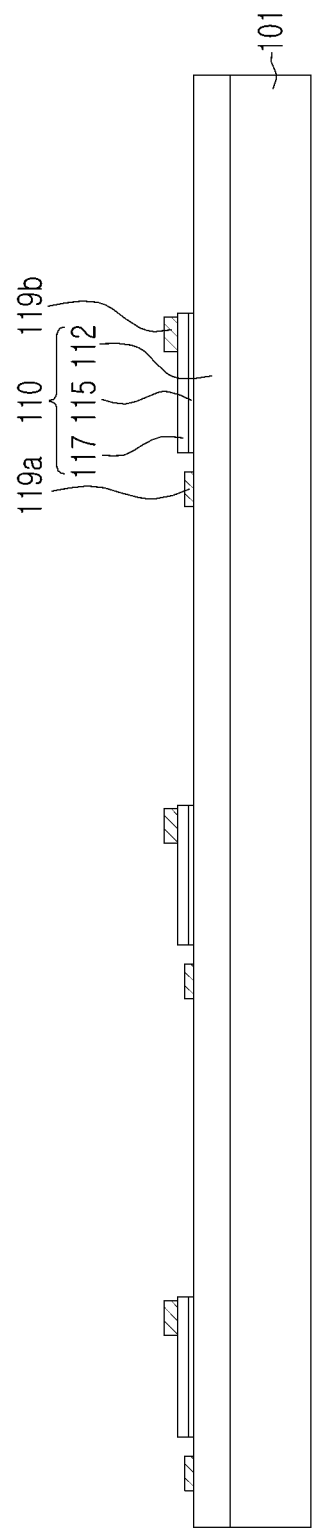

With reference to FIG. 7, a region of the semiconductor layers 110 may be partially removed, thereby allowing a region of the first conductive semiconductor layer 112 to be exposed and forming a first electrode and a second electrode. For example, the second conductive semiconductor layer 117 and the active layer 115 may be partially removed to form a second conductive semiconductor pattern and an active pattern respectively.

A removal process in an example embodiment may be implemented by a dry etching process of removing a region of the second conductive semiconductor layer 117 and the active layer 115. For example, the dry etching process may be provided as a reactive ion etching (RIE) process. The region of the first conductive semiconductor layer 112 exposed by removing of the second conductive semiconductor layer 117 and the active layer 115 may be provided as a region for the first electrode.

A first electrode 119a and a second electrode 119b, connected to a region of the first conductive semiconductor layer 112 and a region of the second conductive semiconductor layer 117, respectively, may be formed. For example, each of the first electrode 119a and the second electrode 119b may include a material, such as silver (Ag), nickel (Ni), aluminum (Al), rhodium (Rh), palladium (Pd), iridium (Ir), ruthenium (Ru), magnesium (Mg), zinc (Zn), platinum (Pt), and/or gold (Au), and may be provided to have a single layer or a dual-layer or higher (e.g., three or more layers) structure. A structure for an LED cell may be formed using processes described above.

Figure 8:
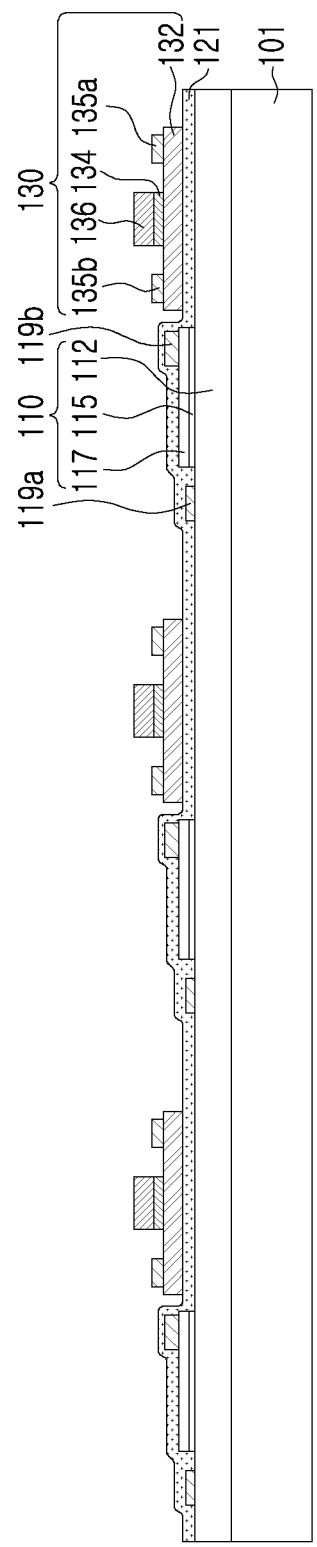

With reference to FIG. 8, an insulating film 121 may be formed in the structure for the LED cell (i.e., on the semiconductor layers 110), and a TFT cell 130 may be formed on the insulating film 121.

The insulating film 121 may be formed on the semiconductor layers 110. The insulating film 121 may include $SiO_2$, $Si_3N_4$, $HfO_2$, SiON, $TiO_2$, $Ta_2O_3$ or $SnO_2$. A semiconductor layer 132 may be formed on the insulating film 121 to provide a channel region. For example, a semiconductor film (not shown) may be formed on the whole surface of the insulating film 121, e.g., by atomic layer deposition (ALD) or chemical vapor deposition (CVD), and then the semiconductor film may be patterned to form the semiconductor layer 132 as shown in FIG. 8. For example, the patterning of the semiconductor film may be performed by a photolithography process. For example, the semiconductor layer 132 may include a silicon-based semiconductor, such as polysilicon, a semiconductor oxide, such as indium gallium zinc oxide (IGZO), copper oxide (CuO, $Cu_2O$), zinc oxide (ZnO), etc., or a compound semiconductor, such as silicon germanium (SiGe), gallium arsenide (GaAs), etc. A gate insulating film 134 and a gate electrode 136 may be sequentially formed on a channel region of the semiconductor layer 132. For example, a gate insulating layer (not shown) and a gate electrode layer (not shown) may be formed on the whole surfaces of the semiconductor layer 132 and the insulating film 121, and then the gate insulating layer and the gate electrode layer may be patterned to form the gate insulating film 134 and the gate electrode 136. For example, the gate insulating layer and the gate electrode layer may be formed by ALD processes or CVD processes. In certain embodiments, the gate electrode layer may be formed by a sputtering process. For example, the gate insulating layer and the gate electrode layer may be patterned by respective photolithography processes. In certain embodiments, the gate insulating layer and the gate electrode layer may be patterned by the same photolithography process, e.g., by using the same photoresist pattern. When the gate insulating layer and the gate electrode layer are patterned by using the same photoresist pattern, the edge lines of then patterned gate insulating film and the gate electrode may be substantially the same. The gate electrode may include conductive semiconductor material, e.g., doped polysilicon. In certain embodiments, the gate electrode may include a metal, e.g., copper, aluminum, tungsten, gold, silver, etc. The gate insulating film may include an oxide material, e.g., silicon oxide, or a nitride material, e.g., silicon nitride. A source electrode 135a and a drain electrode 135b may be formed in opposing regions of the gate electrode 136, respectively. For example, the source/drain electrodes 135a and 135b may be metal patterns. In certain embodiments, the source/drain electrodes 135a and 135b may be conductive semiconductor patterns, e.g., doped semiconductor pattern formed on the semiconductor layer 132 or doped semiconductor regions formed in the semiconductor layer 132. For example, when the source/drain electrodes 135a and 135b are doped semiconductor patterns formed on the semiconductor layer 132, the gate electrode and the source/drain electrodes 135a and 135b may include the same material. When the source/drain electrodes 135a and 135b are doped semiconductor regions of the semiconductor layer 132, the source/drain regions may be formed with an ion implantation process. When the source/drain electrodes 135a and 135b are metal patterns, an ohmic contact layer may be formed between the semiconductor layer 132 and the source/drain electrodes 135a and 135b. The TFT cell 130 may be provided through a similar or the same processes described above.

Figure 9:
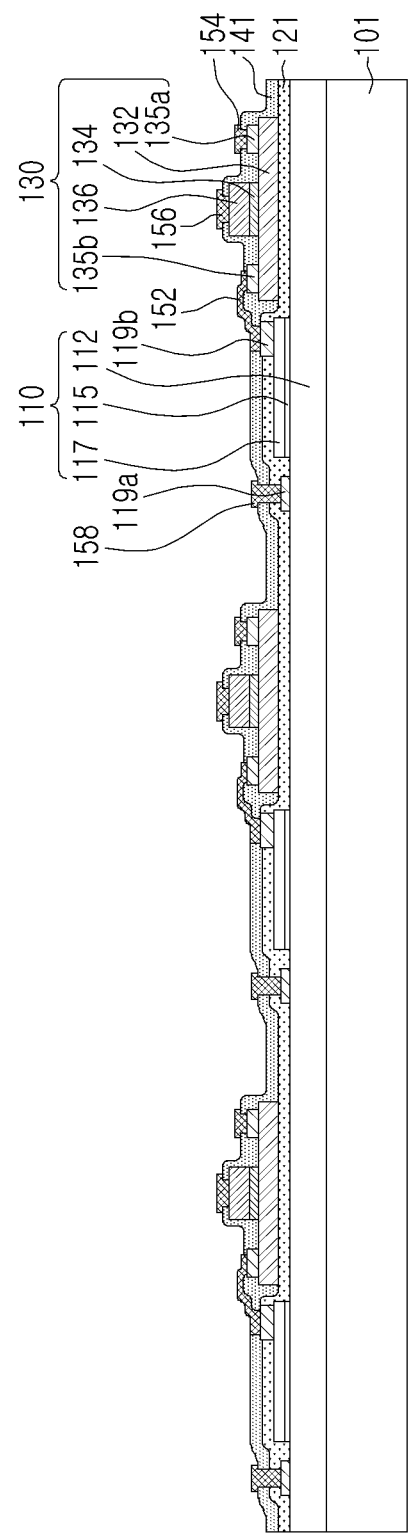

With reference to FIG. 9, a connection wiring 152, a data line 154, a gate line 156, and a common line 158 may be formed to connect the LED cells to circuits outside the pixel array (e.g., driver circuits 210, 220).

First, a protective insulating layer 141 may be formed on a structure in which the TFT cell 130 is formed, and a region to be connected to a conductive line forming the TFT circuitry may be partially opened. For example, a source electrode 135a, a drain electrode 135b, and a gate electrode 136 of a plurality of TFT cells 130 and the first electrode 119a and the second electrode 119b of the LED cell may be partially exposed through the opened region. For example, the protective insulating layer 141 may include $SiO_2$, $Si_3N_4$, $HfO_2$, SiON, $TiO_2$, $Ta_2O_3$, or $SnO_2$. As described above, the protective insulating layer 141 may be a DBR multilayer film in which dielectric films having different refractive indices are stacked. For example, the protective insulating layer 141 may include a multilayer film in which two different layers are alternately stacked.

Referring to FIGS. 3 and 9, the connection wiring 152 may electrically connect respective the drain electrodes 135b of the plurality of TFT cells 130 to the second electrodes 119b of the LED cells. The data line 154 may electrically connect the source electrodes 135a of the plurality of TFT cells 130 in a row direction. The gate line 156 may electrically connect the gate electrodes 135b of the plurality of TFT cells 130 in a column direction. The common line 158 may electrically connect the first electrodes 119a of the LED cells in the row direction and/or in the column direction, and the common line 158 may be grounded. The TFT circuitry including the TFT cell 130 may be provided using similar or the same processes described above. For example, when the active region DA and the driving circuits 210 and 220 are disposed on the same substrate 160, the active region DA and the driving circuits 210 and 220 may be formed on a same semiconductor substrate, e.g., a growth substrate 101, and then may be integrally transferred to a support substrate 160. In certain embodiments, when the active region DA and the driving circuits 210 and 220 are disposed on the same substrate 160, the active region DA and the driving circuits 210 and 220 may be formed from different semiconductor substrates, and then may be transferred separately to the support substrate 160.

Figure 10:
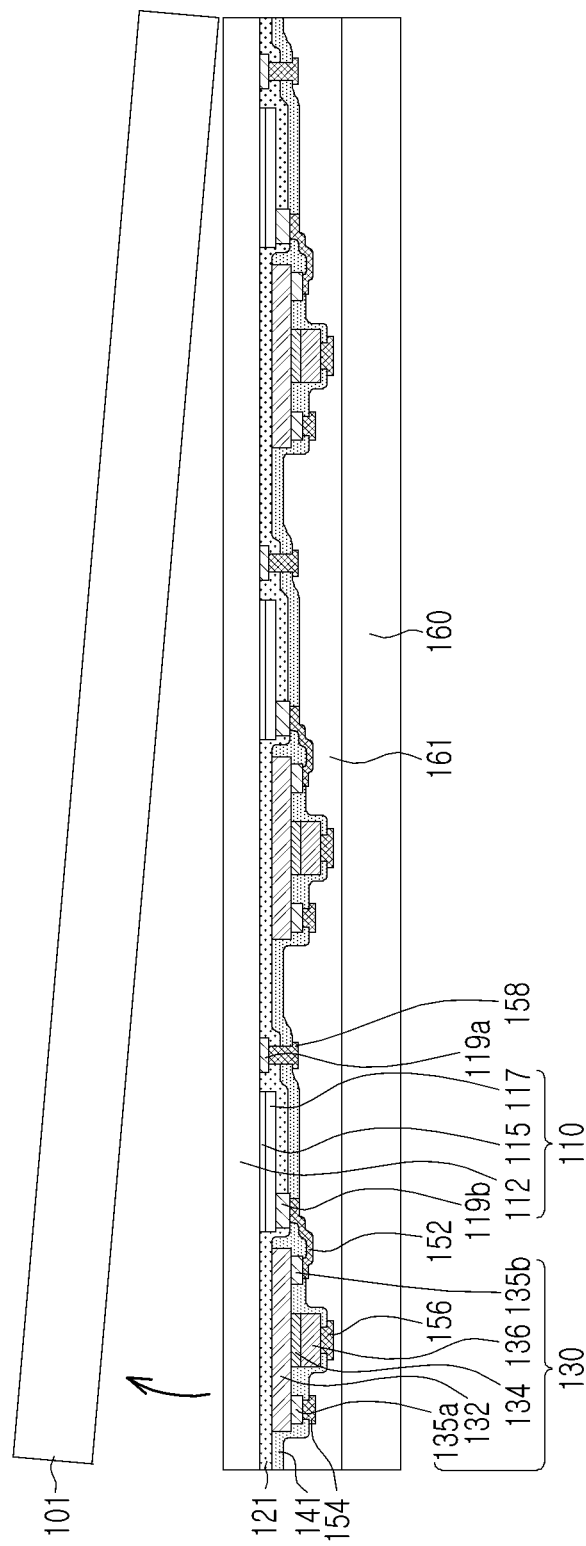

With reference to FIG. 10, an LED array including the TFT cell 130 formed therein may be bonded to a support substrate 160, and the growth substrate 101 may be removed from the LED array. For example, the LED array including a plurality of LEDs formed on a growth substrate may be bonded at a time to a support substrate 160. For example, the LED array including a plurality of LEDs and a plurality of TFTs electrically connected to the plurality of LEDs respectively may be bonded at a time to a support substrate 160, and then the growth substrate may be removed from the LED array.

The LED array including the TFT cell 130 formed therein may be bonded to the support substrate 160 using a bonding resin layer 161. For example, the bonding resin layer 161 may include at least one material selected from a group consisting of polyacrylate, polyimide, polyamide, and benzocyclobutene. In certain example embodiments, the bonding resin layer 161 may include a light reflective powder to prevent light leakage in a direction toward the support substrate 160. For example, the light reflective powder may include an oxide, such as titanium dioxide ($TiO_2$) or aluminum oxide ($Al_2O_3$), or metal particles.

After the support substrate 160 is bonded to the LED array, the growth substrate 101 may be removed from the LED array. The removal of the growth substrate 101 may be performed by a wet etching process, a dry etching process, or a laser lift-off (LLO) process. In certain embodiments, mechanical polishing may be used to remove the growth substrate 101.

Figure 11:
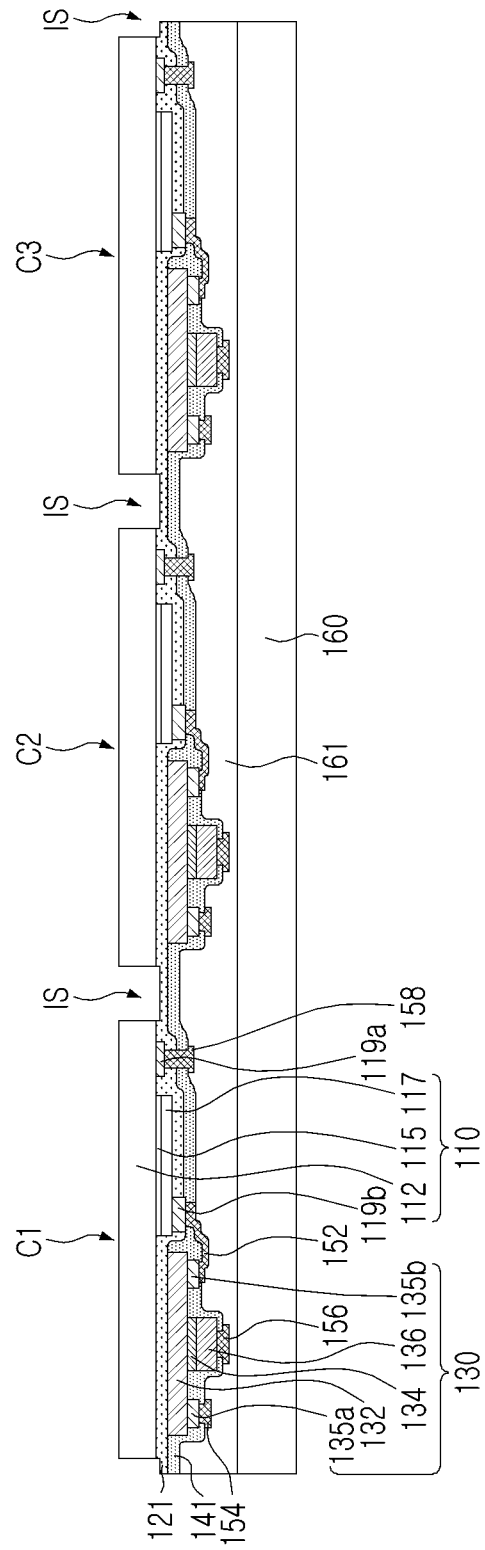

With reference to FIG. 11, the second conductive semiconductor layer 112 may be divided to form individual LED cells of the LED array. For example, the second conductive semiconductor layer 112 may be partially removed to form a second conductive semiconductor pattern.

The semiconductor layers 110 may be isolated using an isolation process, thereby forming a first LED cell C1, a second LED cell C2, and a third LED cell C3. In the isolation process, the dry etching process, such as RIE, may be used. Each of the first LED cell C1, the second LED cell C2, and the third LED cell C3 may be formed to be a micro LED having a side having a length of 10 μm or less. For example, longest sides of the respective LED cells may be 10 μm or less, e.g., in a plan view. For example, during the isolation process, a portion of the second semiconductor layer 112 may be removed until the insulating film 121 is exposed to form an isolation trench IS, thereby forming second conductive semiconductor patterns with the second conductive semiconductor layer 112.

Figure 12:
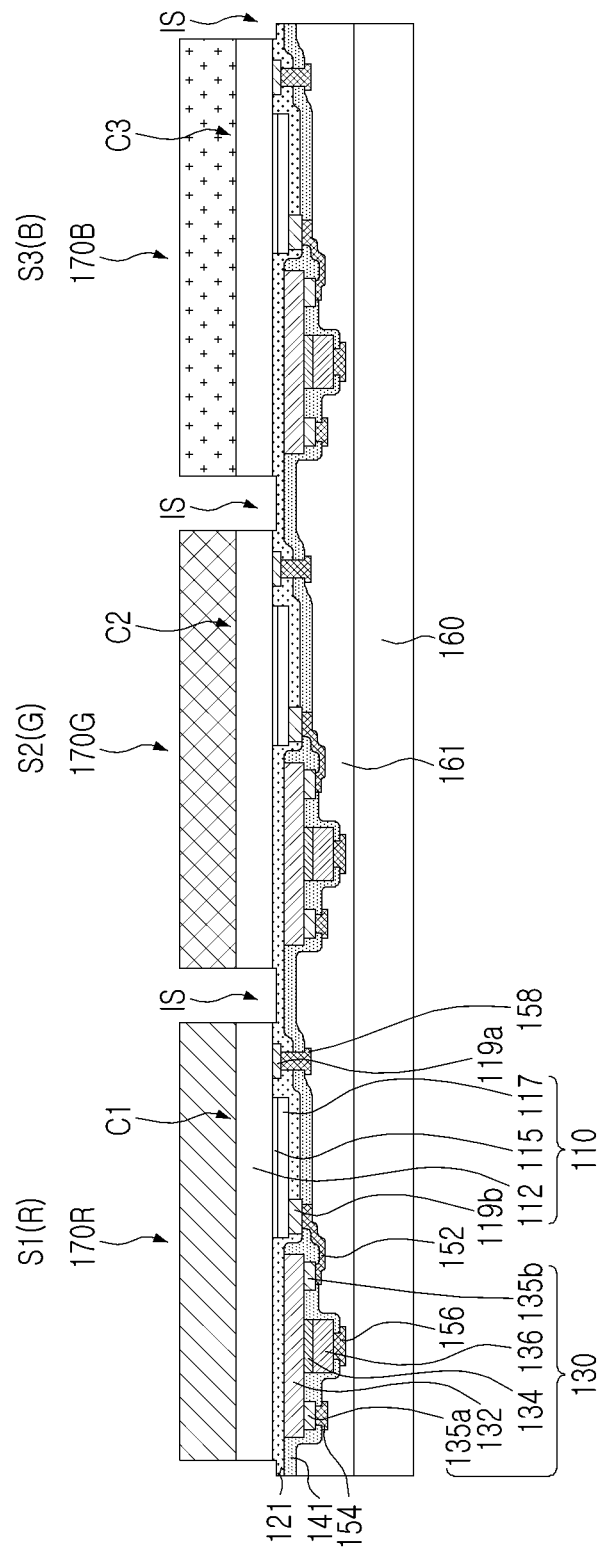

With reference to FIG. 12, a first wavelength conversion pattern 170R, a second wavelength conversion pattern 170G, and a third wavelength conversion pattern 170B may be formed on second surfaces 100B of the first LED cell C1, the second LED cell C2, and the third LED cell C3, respectively. For example, the edges of the first conductive semiconductor pattern 112 and a corresponding wavelength conversion pattern 170R, 170G or 170B formed on the first conductive semiconductor pattern 112 may be substantially the same, e.g., in a plan view. For example, the longest side of the first conductive semiconductor pattern 112 may be 10 μm or less, e.g., in a plan view.

The first wavelength conversion pattern 170R, the second wavelength conversion pattern 170G, and the third wavelength conversion pattern 170B may be formed using a photosensitive resin composition in which red, green, and blue quantum dots are mixed, respectively. For example, the red, green and blue quantum dots may be disposed between photosensitive resin molecules in the first, second and third wavelength conversion patterns 170R, 170G and 170B respectively. The first wavelength conversion pattern 170R, the second wavelength conversion pattern 170G, and the third wavelength conversion pattern 170B may be formed using respective photolithography processes. Since the first wavelength conversion pattern 170R, the second wavelength conversion pattern 170G, and the third wavelength conversion pattern 170B are manufactured using photolithography processes, the first wavelength conversion pattern 170R, the second wavelength conversion pattern 170G, and the third wavelength conversion pattern 170B may be provided to have a fine and precise pattern. Each of the first wavelength conversion pattern 170R, the second wavelength conversion pattern 170G, and the third wavelength conversion pattern 170B may be implemented to have a fine pattern having a size corresponding to that of a subpixel (e.g., a side having a length of 10 μm or less). For example, longest sides of the respective wavelength conversion patterns may be 10 μm or less, e.g., in a plan view.

A quantum dot mixed in the photosensitive resin composition may be provided as a quantum dot having an organic ligand on a surface thereof. The photosensitive resin composition may include a photo-initiator, an organic binder, a light-cured monomer, and a solvent. For example, the photo-initiator may include at least one selected from an oxime compound, a phosphine oxide compound, and an amino ketone compound. The organic binder may include a polymer containing a carboxyl group (—COOH). The light-cured monomer may include a monomer including a carbon-carbon double bond.

Each of the first wavelength conversion pattern 170R, the second wavelength conversion pattern 170G, and the third wavelength conversion pattern 170B, obtained after the photolithography process, may include a complex of the quantum dots having a color and/or the polymer. For example, the first, second and third wavelength conversion patterns 170R, 170G and 170B may include quantum dots having red, green and blue colors respectively. The polymer may be provided as a host matrix in which the quantum dots are dispersed. The polymer may be obtained from a photosensitive resin composition after a photolithography (exposure/development) process.

Referring to FIG. 2, a light blocking wall 180 is formed between the wavelength conversion patterns 170R, 170G and 170B and between the first conductive semiconductor patterns 112. For example, a light blocking material layer (not shown) may be formed on the wavelength conversion patterns 170R, 170G and 170B, and in the isolation trench IS. The light blocking material layer formed on the wavelength conversion patterns 170R, 170G and 170B may be removed by a chemical mechanical polishing (CMP) process or by an etching process, thereby forming a light blocking wall/pattern 180. For example, top surfaces of the light blocking pattern 180 and the wavelength conversion patterns 170R, 170G and 170B may have substantially the same level. For example, the second conductive semiconductor patterns 117 may respectively have smaller areas than the first conductive semiconductor patterns 112. For example, the second conductive semiconductor patterns 117 and the active patterns 115 may respectively have the same areas in a plan view.

As set forth above, according to example embodiments of the present inventive concept, a high-resolution display device implemented on a wafer level and including a micro LED cell without an individual transfer process of cell units may be provided. A wavelength conversion pattern provided in a subpixel may be formed to have a fine size (e.g., 10 μm or less) using a photosensitive resin composition, such as a photoresist, using a lithography process.

While example embodiments have been shown and described above, it will be apparent to those skilled in the art that modifications and variations could be made without departing from the scope of the present inventive concept as defined by the appended claims.

What is claimed is:
1. A display device, comprising:
 a plurality of pixels, each pixel including a plurality of subpixels;
 a light emitting diode (LED) array including a plurality of LED cells, each of the plurality of LED cells provided as part of a corresponding one of the plurality of subpixels, each of the plurality of LED cells including a first conductive semiconductor layer, an active layer and a second conductive semiconductor layer, the first conductive semiconductor layer having a first surface and a second surface opposite to each other, the active layer and the second conductive semiconductor layer sequentially disposed on a first region of the first surface of the first conductive semiconductor layer, the active layer configured to emit light having substantially the same wavelength;
 thin-film transistor (TFT) circuitry including a plurality of TFT cells, each of the plurality of TFT cells disposed on a second region of a corresponding first surface of the first conductive semiconductor layer, each of the plurality of TFT cells including source and drain regions and a gate electrode disposed between the source and drain regions;

wavelength conversion patterns, each wavelength conversion pattern disposed on a corresponding second surface of the first conductive semiconductor layer, each wavelength conversion pattern including a composite of a quantum dot, the quantum dot configured to emit a different color of light from colors of light emitted from the other subpixels of the plurality of subpixels included in the same pixel;

an insulating film disposed between each of the plurality of LED cells and each of the plurality of TFT cells, the insulating film extending between the LED cells in a plan view, the insulating film having a recess between the LED cells in the plan view; and a light blocking wall disposed between the plurality of LED cells and between the wavelength conversion patterns to separate the plurality of subpixels, wherein the light blocking wall is continuously formed from between the wavelength conversion patterns to a bottom of the recess of the insulating film.

2. The display device of claim 1, wherein the plurality of subpixels comprise a first subpixel configured to emit red light, a second subpixel configured to emit green light, and a third subpixel configured to emit blue light.

3. The display device of claim 2, wherein the plurality of LED cells is configured to emit ultraviolet light or near ultraviolet light, wherein the wavelength conversion patterns include a first wavelength conversion pattern, a second wavelength conversion pattern, and a third wavelength conversion pattern, disposed in the first subpixel, the second subpixel, and the third subpixel, respectively, and wherein the first wavelength conversion pattern, the second wavelength conversion pattern, and the third wavelength conversion pattern include a red quantum dot, a green quantum dot, and a blue quantum dot, respectively.

4. The display device of claim 2, wherein the plurality of LED cells is configured to emit blue light, wherein the wavelength conversion patterns include a first wavelength conversion pattern and a second wavelength conversion pattern, disposed in the first subpixel and the second subpixel, respectively, and wherein the first wavelength conversion pattern and the second wavelength conversion pattern include a red quantum dot and a green quantum dot, respectively.

5. The display device of claim 4, wherein the third subpixel comprises a light transmissive pattern having a thickness corresponding to the first wavelength conversion pattern and the second wavelength conversion pattern disposed on second surfaces of corresponding first conductive semiconductor layers.

6. The display device of claim 1, wherein the wavelength conversion patterns further comprise a polymer.

7. The display device of claim 1, wherein the wavelength conversion patterns comprise a light diffuser selected from a metallic oxide particle, a metal particle, and a combination of a metallic oxide particle and a metal particle.

8. The display device of claim 1, wherein the TFT circuitry comprises a plurality of data lines electrically connecting source regions of the plurality of TFT cells in a row direction and a gate line electrically connecting gate electrodes of the plurality of TFT cells in a column direction.

9. The display device of claim 1, wherein the light blocking wall comprises a black matrix.

10. The display device of claim 1, further comprising a flexible substrate disposed on the plurality of LED cells and the plurality of TFT cells.

11. A display device, comprising:
an array of pixels, each of the pixels including a first subpixel, a second subpixel, and a third subpixel;

a plurality of LED cells, each of the plurality of LED cells forming a part of a corresponding one of the first subpixels, the second subpixels, and the third subpixels, the plurality of LED cells configured to emit light having a first wavelength, each of the plurality of LED cells having a first surface and a second surface opposite to each other;

a plurality of TFT cells respectively disposed on the first surfaces of the plurality of LED cells, each of the plurality of TFT cells including source and drain regions and a gate electrode disposed between the source and drain regions;

a plurality of data lines electrically connecting source regions of the plurality of TFT cells in a row direction;

a gate line electrically connecting gate electrodes of the plurality of TFT cells in a column direction;

a plurality of first wavelength conversion patterns, each first wavelength conversion pattern being disposed on the second surface of a corresponding LED cell that forms a part of a corresponding one of the first subpixels, each first wavelength conversion pattern including a composite of a first quantum dot, the first quantum dot configured to convert light having the first wavelength into light having a second wavelength;

a plurality of second wavelength conversion patterns, each second wavelength conversion pattern being disposed on the second surface of a corresponding LED cell that forms a part of a corresponding one of the second subpixels, each second wavelength conversion pattern including a composite of a second quantum dot, the second quantum dot configured to convert light having the first wavelength into light having a third wavelength;

an insulating film disposed between each of the plurality of LED cells and each of the plurality of TFT cells, the insulating film having a recess formed between the first and second subpixels in a plan view; and a light blocking wall disposed between the first and second subpixels, wherein the light blocking wall is continuously formed from between the first and second wavelength conversion patterns to a bottom of the recess in the insulating film.

12. The display device of claim 11, wherein each of the plurality of LED cells comprises a first conductive semiconductor layer, a second conductive semiconductor layer, and an active layer disposed between the first conductive semiconductor layer and the second conductive semiconductor layer.

13. The display device of claim 11, wherein the light blocking wall is disposed between the LED cells of the first and second subpixels and between the first wavelength conversion pattern and the second wavelength conversion pattern of the first and second subpixels, the light blocking wall separating the first and second subpixels.

14. The display device of claim 11, wherein the light having the first wavelength is blue light, the light having the second wavelength is red light, and the light having the third wavelength is green light.

15. The display device of claim 11, further comprising a third wavelength conversion pattern disposed on a second surface of a third LED cell disposed in a third subpixel, the third wavelength conversion pattern including a composite of a third quantum dot, the third quantum dot configured to convert the light having the first wavelength into light having a fourth wavelength.

16. The display device of claim 15, wherein the light having the first wavelength is ultraviolet light or near ultraviolet light, the light having the second wavelength is blue light, the light having the third wavelength is red light, and the light having the fourth wavelength is green light.

17. The display device of claim 11, wherein the plurality of LED cells has a length of 10 μm or less in a plan view.

18. The display device of claim 11, wherein the plurality of TFT cells comprises polysilicon.

19. The display device of claim 11, wherein each of the plurality of LED cells comprising a first conductive semiconductor pattern, a second conductive semiconductor pattern, and an active pattern disposed between the first conductive semiconductor pattern and the second conductive semiconductor pattern, and wherein each of the plurality of TFT cells is fully covered by the first conductive semiconductor pattern of a corresponding one of the plurality of LED cells in a plan view.

* * * * *